United States Patent
Heinzmann et al.

(10) Patent No.: US 7,091,724 B2
(45) Date of Patent: Aug. 15, 2006

(54) MODEL-BASED FAULT DETECTION IN A MOTOR DRIVE

(75) Inventors: John David Heinzmann, Manchester, NH (US); John B. Morrell, Bedford, NH (US); Jason Michael Sachs, Goffstown, NH (US)

(73) Assignee: DEKA Products Limited Partnership, Manchester, NH (US)

( * ) Notice: Subject to any disclaimer, the term of this patent is extended or adjusted under 35 U.S.C. 154(b) by 155 days.

(21) Appl. No.: 10/625,017

(22) Filed: Jul. 23, 2003

(65) Prior Publication Data

US 2005/0017733 A1   Jan. 27, 2005

(51) Int. Cl.
*G01R 31/06* (2006.01)
*G01R 31/34* (2006.01)

(52) U.S. Cl. ................ 324/546; 324/772
(58) Field of Classification Search ......... 324/772, 324/546, 177; 318/727, 798
See application file for complete search history.

(56) References Cited

U.S. PATENT DOCUMENTS

| | | | |
|---|---|---|---|
| 3,967,199 A * | 6/1976 | Knoop et al. | 324/772 |
| 4,164,705 A * | 8/1979 | Whitney et al. | 324/772 |
| 5,270,640 A | 12/1993 | Kohler et al. | 324/772 |
| 5,514,978 A | 5/1996 | Koegl et al. | 324/772 |
| 5,786,708 A | 7/1998 | Premerlani et al. | 324/772 |
| 6,128,583 A * | 10/2000 | Dowling | 702/58 |
| 6,486,626 B1 * | 11/2002 | Pugh | 318/139 |
| 6,670,785 B1 * | 12/2003 | Liang et al. | 318/801 |

OTHER PUBLICATIONS

Kohler, Jeffery L. et al., *Alternatives for Assessing the Electrical Integrity of Induction Motors*, IEEE transactions On Industry Applications, vol. 28, No. 5, Sep./Oct. 1992.
Moseler, Olaf et al, *Application of Model-Based Fault Detection to a Brushless DC Motor*, IEEE Transactions on Industrial Electronics, vol. 47, No. 5, Oct. 2000.
Peuget, Raphael et al, *Fault Detection and Isolation on a PWM Inverter by Knowledge-Based Model*, IEEE Transactions on Industry Applications, vol. 34, No. 6, Nov./Dec. 1998.
Trutt, Frederick C. et al., *Online Condition Monitoring of Induction Motors*, IEEE Transactions on Industry Applications, vol. 38, No. 6, Nov./Dec. 2002.
Sottile, Joseph et al., *Condition Monitoring of Stator Windings in Induction Motors: Part II—Experimental Investigation of Voltage Mismatch Detectors*; IEEE Transactions on Industry Applications, vol. 38, No. 5 Sep./Oct. 2002.
Polenta, Hector P. et al., *Microcomputer-Based Fault Detection using Redundant Sensors*, IEEE Transactions on Industry Applications, vol. 24, No. 5, Sep./Oct. 1988.
Kral, Christian et al., *Sequences of Field-Oriented Control for the Detection of Faulty Rotor Bars in Induction Machines—The Vienna Monitoring Method*, IEEE Transactions on Industrial Electronics, vol. 47, No. 5, Oct. 2000.

* cited by examiner

*Primary Examiner*—Anjan Deb
(74) *Attorney, Agent, or Firm*—Bromberg & Sunstein LLP (57) ABSTRACT

A method for detecting an open winding in a motor. The method employs passive monitoring of the voltage, current and speed of the motor. A residue voltage is calculated that equals the difference between an idealized set of voltage drops across the motor load elements and the actual voltage drops. When the magnitude of the residue voltage equals or exceeds a threshold, an open winding condition may be declared and appropriate action may be taken.

6 Claims, 6 Drawing Sheets

MODEL-BASED FAULT DETECTION IN A MOTOR DRIVE

TECHNICAL FIELD

The present invention pertains to a method for detecting a fault condition in a motor, such as open motor winding, using residue voltage differences and other passive measures.

BACKGROUND OF THE INVENTION

Dynamically stabilized transporters refer to personal vehicles having a motion control system that actively maintains the stability of the transporter while the transporter is operating. The motion control system maintains the stability of the transporter by continuously sensing the orientation of the transporter, determining the corrective action to maintain stability, and commanding the wheel motors to make the corrective action. If the transporter loses the ability to maintain stability, the rider may experience discomfort at the sudden loss of balance. The risk of such discomfort may be reduced if redundant components are provided in the transporter drive train. For example, providing dual-stators in the motor driving the transporter's ground contacting elements (e.g., wheels) reduces likelihood of loss of balance. When redundant components are provided, a method for detecting failure of a redundant component is desirable so that a failed component may be replaced before a double failure occurs.

Active detection of an open motor winding, namely a periodic attempt to force current into the motor to distinguish between a normal motor and one with an open winding, may not be feasible without requiring the motion control system to give up some control over the motor's torque production. A method for passively monitoring motor winding circuits to determine open circuit conditions would advantageously allow such open circuits to be detected without disturbing motor operation.

SUMMARY OF THE INVENTION

In an embodiment of the present invention, a method is provided for detecting an open winding in a motor. The method employs passive monitoring of the voltage, current and speed of the motor. A residue voltage is calculated that equals the difference between an idealized set of voltage drops across the motor load elements and the actual voltage drops. When the magnitude of the residue voltage equals or exceeds a threshold, an open winding condition may be declared and appropriate action may be taken.

In another embodiment of the invention, a dual-stator redundant motor is provided. The method employs passive monitoring of the voltage, current and speed of the motor for each of the dual-stators of the motor. Residue voltages are calculated for each stator that measure the difference between an idealized set of voltage drops across the respective motor load elements and the actual voltage drops. When the magnitude of the difference of these two residue voltages equals or exceeds a threshold, an open winding condition may be declared and appropriate action may be taken. In a further embodiment of the invention, an open winding may be declared when either the condition on the difference of the residues is met or when the magnitude of either of the residues of the individual-stators equals or exceeds a threshold. In each of these embodiments, an open motor winding or other causes of an open winding circuit, such as an open relay, a broken wire or an open fuse link may be detected.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

The subject matter of this application is related to U.S. Pat. Nos. 5,701,965; 5,971,091; 5,791,425; 6,302,230 and U.S. patent application Ser. No. 09/687,789, "Transporter Improvements," filed Oct. 13, 2000, which are all incorporated herein by reference in their entirety.

In an embodiment of the present invention, a method is provided for detecting an open winding in a motor. The method employs passive monitoring of the voltage, current and speed (or equivalently rotational frequency) of the motor. A residue voltage is calculated that equals the difference between an idealized set of voltage drops across the motor load elements and the actual voltage drops. When the magnitude of the residue voltage equals or exceeds a threshold, an open winding condition may be declared and appropriate action may be taken.

In another embodiment of the invention, a dual-stator redundant motor is provided. The method employs passive monitoring of the voltage, current and speed of the motor for each of the dual-stators of the motor. Residue voltages are calculated for each stator that measure the difference between an idealized set of voltage drops across the respective motor load elements and the actual voltage drops. When the magnitude of the difference of these two residue voltages equals or exceeds a threshold, an open winding may be declared and appropriate action may be taken. In a further embodiment of the invention, an open winding condition may be declared when either the condition on the difference of the residues is met or when the magnitude of either of the residues of the individual-stators equals or exceeds a threshold. In each of these embodiments, an open motor winding or another cause of an open circuit, such as an open relay, may be detected.

Embodiments of the present invention will be described for a dynamically balancing transporter. These embodiments are presented by way of illustration and not for limiting the scope of the invention as described by the appended claims. As those skilled in the art will recognize, the present invention may be used in any device where detection of an open winding circuit is desired.

Dynamically-Balancing Transporter

A personal transporter may be said to act as dynamically 'balancing' if it is capable of operation on one or more wheels but would be unable to stand on the wheels but for operation of a control loop governing operation of the wheels. A balancing personal transporter lacks static stability but is dynamically balanced.

Figure 1:
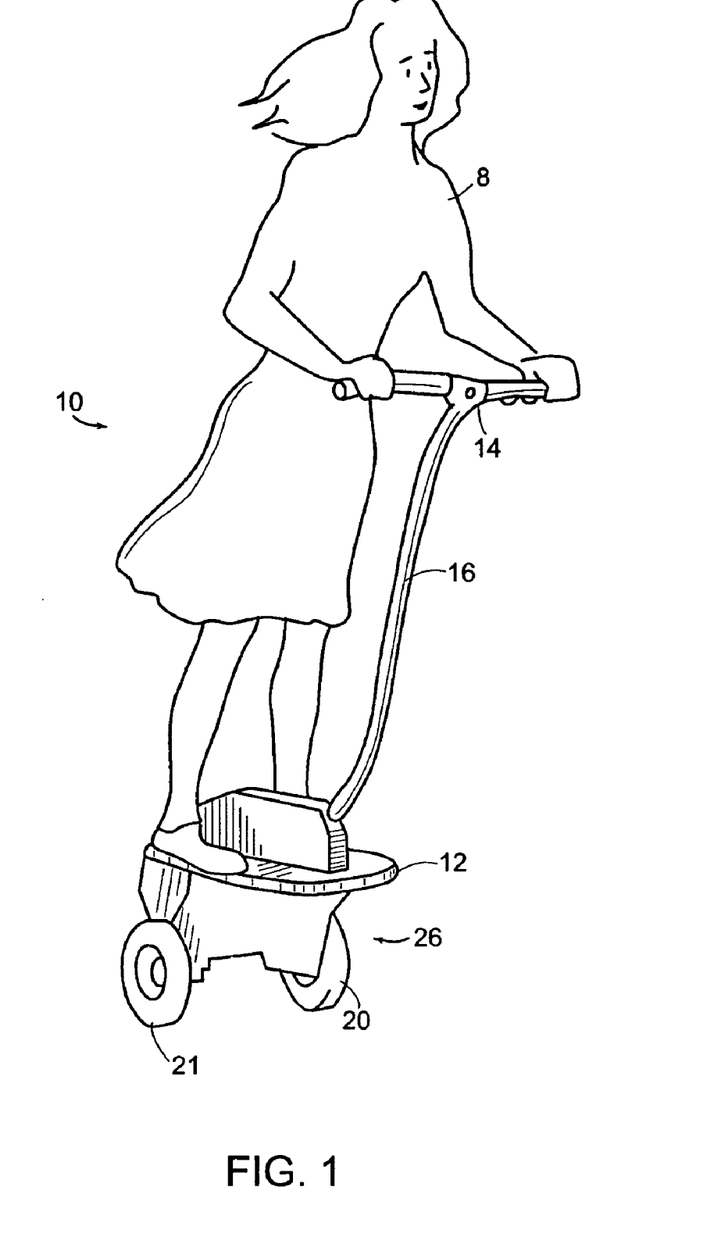
FIG. 1 is a side view of a personal vehicle lacking a stable static position, for supporting or conveying a subject who remains in a standing position thereon.

An embodiment of a balancing personal transporter is depicted in FIG. 1 and designated generally by numeral 10. User 8 is shown in FIG. 1, standing on platform (or 'base') 12 of ground-contacting module 26. Wheels 20 and 21 are shown as coaxial about the Y axis. A handlebar 14 may be provided on stalk 16 for gripping by the user.

Figure 2:
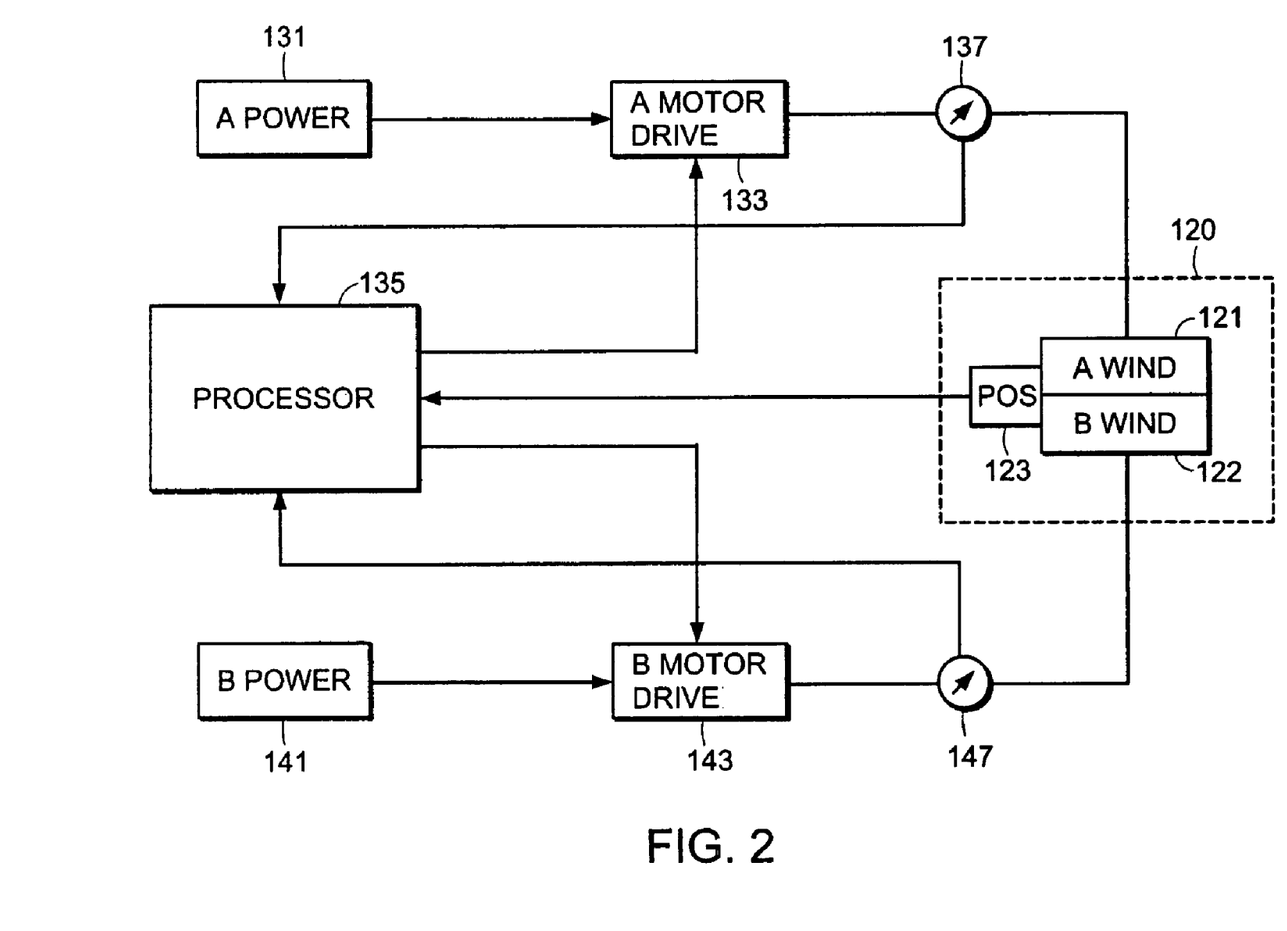
FIG. 2 shows a block diagram of the system architecture of an embodiment of the present invention.

Referring now to FIG. 2, a block diagram is shown of a system architecture for an embodiment of the present invention. This block diagram shows the architecture for controlling and driving one wheel 20 of transporter 10. An analogous block diagram applies to controlling and driving the other wheel 21 of the transporter. A motor 120 drives wheel 20 of the transporter. The motor 120 is preferably DC brushless, but may be either AC or DC motors and either brushed or brushless. The motor 120 is energized by a redundant set of windings 121, 122. Both windings are capable of energizing the motor either independently or simultaneously. Motor 120 has a sensor 123 that measures the position or angular velocity of the motor shaft. Conversion of a signal representing instantaneous shaft velocity to or from a signal representing position is accomplished by integrating or differentiating the signal, respectively.

Processor 135 monitors various parameters of each winding 121, 122 via sensors 137, 147 that monitor at least the voltage and current for each winding. Processor 135 controls the voltage or current applied to each winding via the A winding motor drive 133 and the B winding motor drive 143. The A winding motor drive 133 derives power from the A power supply 131 and the B winding motor drive derives power from the B power supply 141.

Open Winding Detection

A method is described below for detecting an open winding in a motor 120 according to an embodiment of the invention. By way of example, but not for limitation, this method may be performed using a computer processor, such as processor 135 in the architecture described above.

This method assumes that:
1. The electrical relationship between motor terminal voltage, current, and motor speed is approximately known under normal circumstances, and changes in the case of an open winding.
2. In a system containing a motor with a dual—redundant winding, at most one of the two stators will contain an open winding. Further, the electrical parameters of the motor (e.g., back-EMF constant Ke, resistance R, and inductance L) will be reasonably matched between the two half-motors.

A quantity, which will be called the "residue voltage" in this specification and in any appended claims, can be calculated by subtracting estimated values of the components that make up motor voltage, i.e., back-EMF and IR voltage drops, from the measured value of the motor voltage itself. The residue voltage effectively compares the actual value of motor voltage to its expected value during normal operation. A large residue voltage may indicate the presence of a fault condition, which could be due to an open winding or an open relay or another open component in the winding circuit. The term "open winding condition" in this specification and in any appended claims will be understood to mean an open winding or another cause of an open circuit in the motor. Further, "open winding condition" will also include: improper measurement of motor voltage, current and/or speed or a mismatch between motor parameters and their estimated values. Ideally, when there is no open winding condition, this residue voltage should always be zero. Some assumptions about the motor resistance and back EMF constant must be made to calculate these voltage drops and precise measurements of motor voltage, current and frequency must be obtained. In reality, these ideal conditions do not occur so errors present in these numbers can produce significant residue levels. An analysis of these errors is presented in Appendix A. Further, in this embodiment of the invention, the measurements of motor speed, current and voltage are all filtered at different frequencies, contributing to a non-zero residue voltage even with no open winding condition. Therefore, data acquisition filter lags are accounted for in the residue calculation, as described in Appendix B. Under these assumptions, it is possible to observe an open winding passively (in other words without requiring any changes to motor commands), when the torque commanded is sufficiently large to produce an observable effect.

For a DC motor, the following equation holds:

$$V = K_e \cdot \omega_m + I \cdot R + L \frac{dI}{dt}$$

where:
V is the voltage across the motor,
$K_e$ is the back-EMF constant of the motor,
$\omega_m$ is the mechanical speed of the motor,
I is the current through the motor,
R is the motor winding resistance, and
L is the motor winding inductance.

Under steady-state operation, $$L \frac{dI}{dt}$$

is approximately zero and a residue, r, can be calculated.

$$r = V - K_e \cdot \omega_m - I \cdot R$$

where V, I, and $\omega_m$ are measured quantities and $K_e$ and R are estimates of motor parameters.

If r is approximately zero, then the relationship between measured motor voltage, current and speed matches what is expected and the motor can be assumed to be operating normally.

If r is non-zero, it may indicate that a fault (an open winding condition) has occurred.

Such faults may include:
an open winding or broken wire has occurred;
voltage, current and/or speed may be measured improperly; or
motor parameters $K_e$ and R do not match their estimated values.

Similar equations hold true for a three-phase permanent magnet synchronous motor ("PMSM").

In the synchronous (rotor) reference frame of a PMSM, the following equations hold when no open winding condition is present:

$$V_{qLN} = K_{eLN} \cdot \omega_m + I_q \cdot R_{LN} + I_d \cdot \omega_e \cdot L_{LN} + L_{LN} \frac{dI_q}{dt}$$

$$V_{dLN} = I_d \cdot R_{LN} - I_q \cdot \omega_e \cdot L_{LN} + L_{LN} \frac{dI_d}{dt}$$

where:

the subscript "LN" denotes line-neutral quantities;

"d" refers to the direct-axis of the synchronous reference frame, where currents are non-torque producing and voltages are out of phase with back-EMF;

"q" refers to the quadrature-axis of the synchronous reference frame, where currents are torque producing and voltages are in-phase with back-EMF;

$K_{eLN}$ is the motor's back-EMF constant;

$I_q$ and $I_d$ are the synchronous-frame components of motor current;

$V_{qLN}$ and $V_{dLN}$ are the synchronous-frame components of line-neutral motor voltage;

$R_{LN}$ is the line-neutral resistance;

$L_{LN}$ is the line-neutral inductance;

$\omega_m$ is the mechanical speed of the motor;

$\omega_e$ is the electrical frequency, equal to p/2 times $\omega_m$, where p is the number of motor poles;

d( )/dt is differentiation with respect to time.

For the steady state case where $$\frac{dI_q}{dt} \text{ and } \frac{dI_d}{dt}$$

are zero, a residue voltage, $r_q$, may be calculated where:

$$r_q = V_{qLN} - I_q \cdot R_{LN} - K_{eLN} \cdot \omega_m - I_d \cdot \omega_m \cdot L_{LN},$$

where $V_{qLN}$, $I_q$, $I_d$ and $\omega_m$ are derived from measurements, while $R_{LN}$ and $K_{eLN}$ are estimated. $r_q$ has units of volts, line-to-neutral. Note that if $I_d$ is controlled to zero, then the last term in the preceding equation can be ignored.

When no open winding condition is present, $r_q$ is approximately zero.

When there is either an entire set of open windings or a single open winding, the residue voltage, $r_q$ tends to be non-zero for either of two cases:

1. When the motor is commanded in a voltage mode and when the commanded $V_{qLN}$ differs from the internal back-EMF, $K_{eLN} \cdot \omega_m$, i.e. current would flow in a normal motor but cannot due to the open winding; or 2. when the motor is commanded in a current mode and the current commanded is non zero.

In either of these cases, the residue of a system with an open winding begins to diverge from zero (the expected residue for a normal system), and the open winding can be detected. Current mode motor commands tend to produce larger residues because the motor drive is actively trying to force current through the motor, and in the case of an open winding, $V_{qLN}$ becomes very large (at all times in the case of an open winding set, and at various times depending on the speed and electrical angle for a single open winding in a winding set). In voltage mode $V_{qLN}$ becomes only as large as its command (with some torque ripple in a motor with a single open winding, because this is an unbalanced load).

In practice, the residue voltage can be compensated for differences in the time delays that are introduced by analog low-pass-filters on the voltage, current, and speed sensor inputs, by calculating the residue in the following manner:

$$r_q = V_{qLN} - I_q \cdot R_{LN} + (K_d \cdot V_{dLN} - K_{eLN}) \cdot \omega_m$$

where $$K_d \approx \frac{p}{2} \cdot \Delta\tau$$

p=number of motor poles $\Delta\tau$=time delay, between position and voltage sense.

Such compensation greatly improves the accuracy of detection. The derivation for this equation is discussed in Appendix B.

Calculation of the residue voltage, $r_q$, provides a test that can be used in a motor drive, regardless of whether it is in a single-stator motor or a dual-stator redundant motor, namely:

$$B_{ow} = (|LPF(r_q)| > R_{THRESH}),$$

where $B_{ow}$ is a Boolean value that represents whether an open winding condition has been detected and "LPF" means that the value of $r_q$ has been filtered with a low-pass filter. The low-pass filter's cutoff frequency should be a compromise between rejecting high-frequency errors and a sufficiently rapid detection. A value of $\approx 1.5$ Hz has been used advantageously in a dynamically balancing transporter.

In a system with a dual-stator redundant motor, two residues $r_{qA}$ and $r_{qB}$ may be calculated. A second test that can be then applied is:

$$B_{ow\_AB} = (|LPF(r_{qA}) - LPF(r_{qB})| > R_{THRESH\_AB}),$$

where $B_{ow\_AB}$ is also a Boolean value that represents whether an open winding condition has been detected.

The system can use both bits, namely, if $$(B_{ow} = \text{TRUE}) \text{ or } (B_{ow\_AB} = \text{TRUE})$$

then an open winding condition is detected: take appropriate action.

If both halves of the redundant motor are driven with similar voltage commands, then $B_{ow\_AB}$ is more sensitive in detecting open windings than $B_{ow}$ alone, because some of the errors listed in Appendix A cancel out partially or completely.

Note, however, that calculating $B_{ow\_AB}$ requires some communication between the two motor drives controlling current into the two stators, A and B. Further, $r_{qA}$ and $r_{qB}$ used in the above equation should correspond to the same instant in time, so that if side A gets $r_{qB}$ with a delay, the same delay should be incorporated in its own residue, $r_{qA}$, before subtracting the two residues.

Figure 3:
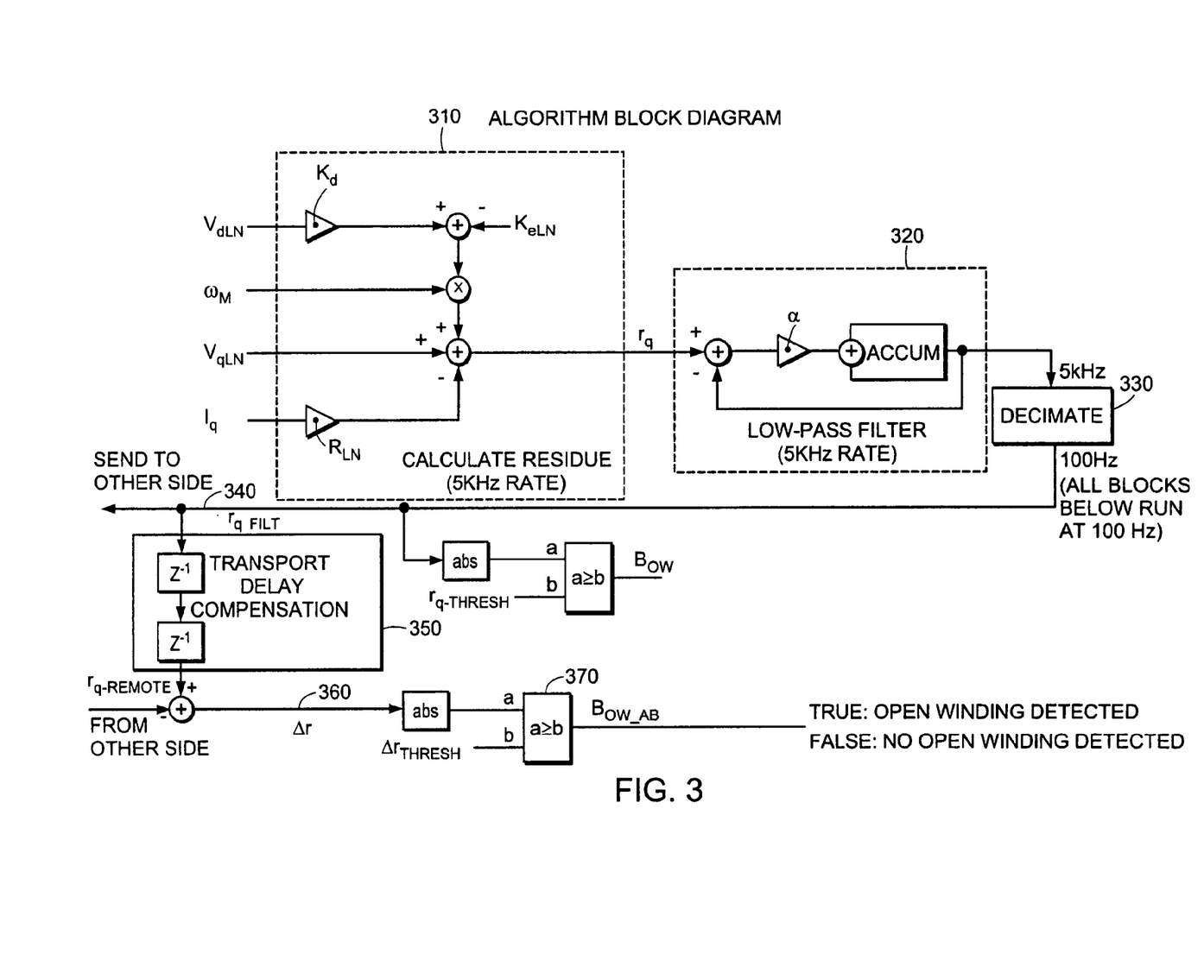
FIG. 3 is a block diagram for an algorithm for detecting opening windings in a dual-stator redundant motor according to an embodiment of the invention.

A block diagram for the algorithm for this embodiment of the invention is depicted in FIG. 3. Typical values of update rate are shown for the various blocks. First, the residue voltage, $r_q$, is calculated 310. This voltage is run through a low-pass filter 320 and then sampled 330 at a 100 Hz rate. The filtered value of $r_q$ 340 is passed as an input to a corresponding algorithm for the other stator. The difference in time between the values of $r_q$ for each side is compensated 350 and a voltage difference is formed 360. Finally, the voltage difference is compared to the threshold 370.

Motor Measurements

Voltages $V_q$ and $V_d$ and currents $I_q$ and $I_d$ are used in synchronous-frame control algorithms for three-phase motor drives: phase voltages and currents, which oscillate at the motor's electrical frequency, are changed to DC or slowly-varying quantities which can be more easily controlled with zero steady-state error.

Figure 4:
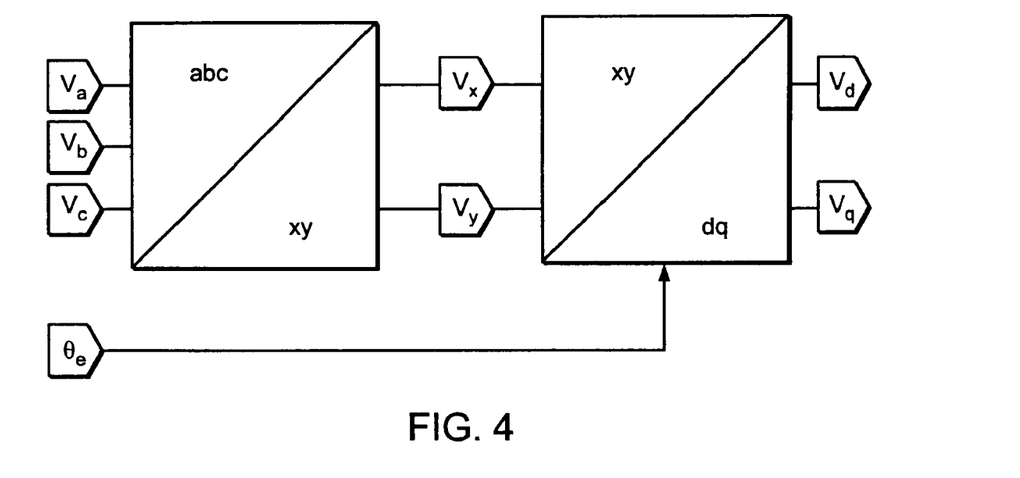
FIG. 4 is a block diagram of an exemplary reference transform according to an embodiment of the invention.

A block diagram of an exemplary reference transform is shown in FIG. 4

Referring to FIG. 4, where $V_a$, $V_b$, $V_c$ are measured motor phase voltages and $\theta_e$ is an electrical angle derived from a position sensor (e.g. resolver, encoder, etc.), the "abc/xy" and "xy/dq" blocks function as follows:

$V_x = \frac{2}{3}V_a - \frac{1}{3}V_b - \frac{1}{3}V_c$;

$V_y = 1/\sqrt{3}(V_b - V_c)$;

$V_d = V_x \sin(\theta_e) - V_y \cos(\theta_e)$; and $V_q = V_x \cos(\theta_e) + V_y \sin(\theta_e)$.

Equivalent formulations of these equations will be apparent to those skilled in the art. All formulations have the property that if $V_a = A \cos(\theta_e) + B \sin(\theta_e) + C$;

$V_b = A \cos(\theta_e - 120°) + B \sin(\theta_e - 120°) + C$; and $V_c = A \cos(\theta_e - 240°) + B \sin(\theta_e - 120°) + C$.

then the transformation yields $V_q = A$ and $V_d = B$ (or $V_q = -B$ and $V_d = A$ in some formulations). Thus, a three-phase set of oscillating waveforms is transformed into a pair of DC values which are sufficient to describe the magnitude and phase of the original signals. The same transform equations may be used to calculate $I_d$ and $I_q$ from phase currents $I_a$, $I_b$, and $I_c$.

It should be understood that measuring voltages $V_q$ and $V_d$ and currents $I_q$ and $I_d$ implies deriving them from measured phase voltages and currents and measured motor positions. Likewise, in this specification and in any appended claims, unless context requires otherwise, "measuring a speed" includes direct speed measurement or taking a series of position measurements with associated times and then calculating a speed.

ALGORITHM INITIALIZATION

The residue voltage filters need to be zeroed after a sufficient interval has elapsed after transporter startup. For a dual-stator motor, the algorithm results may be ignored until the remote data communication busses described in connection with FIG. 2 have been synchronized. The response to the algorithm may be disabled for a fixed delay, such as 250 milliseconds, after this initialization as added insurance against a false positive at start-up. The primary issue is that until the filters on both sides are zeroed, the delta residue can be quite large, especially if one side has been zeroed and the other has not yet. The transport delay between the two sides can further complicate matters. The one-time 250 ms suppression of the response to the algorithm at startup more than adequately addresses this concern.

The described embodiments of the invention are intended to be merely exemplary and numerous variations and modifications will be apparent to those skilled in the art. All such variations and modifications are intended to be within the scope of the present invention as defined in the appended claims.

Appendix A: Sources of Error in Residue-based Open-winding Detection

Residue voltage equation:

theoretical: $r_q = V_{qLN} - K_{eLN}\omega_m - I_q R_{LN}$ computed: $r_q = \hat{V}_{qLN} - \hat{K}_{eLN}\hat{\omega}_m - \hat{I}_q \hat{R}_{LN}$, $\hat{V}_{qLN} = \hat{V}_{qLN} + \hat{K}_d \hat{V}_{dLN}\omega_m$ Terminal voltage equations for 3-phase permanent magnet synchronous motor:

$$V_{qLN} = e_q + I_q R_{LN} + I_d \omega_e L_{LN} + L_{LN}\frac{dI_q}{dt}$$

$$V_{dLN} = e_d + I_d R_{LN} - I_q \omega_e L_{LN} + L_{LN}\frac{dI_d}{dt}$$

$$e_q = K_{eLN}\omega_m \cos\tilde{\theta}_e$$

$$e_d = K_{eLN}\omega_m \sin\tilde{\theta}_e$$

($\tilde{\theta}_e$ is error in estimate of electrical angle, normally 0)

| Source of error | Approx. (small-signal) error in $r_q$ | qualitative | typical quantitative | Significance (Δ: is this term reduced when comparing halves of a redundant motor?) Δ | |
|---|---|---|---|---|---|
| $\tilde{K}_{eLN}$ | $-\tilde{K}_{eLN}\omega_m$ | Large | 7% $V_0$ | yes | Motor parameter tolerance $V_0 = \frac{V_{bus}}{\sqrt{3}} \approx$ full scale line-neutral voltage. |
| $\tilde{R}_{LN} = R_{LN} - \hat{R}_{LN}$ (actual − estimate) | $-I_q\tilde{R}_{LN}$ | Possibly large | 10% $I_q R_{LN}$ | yes ($I_{qdm} \approx 0^1$) | Motor parameter tolerance |
| $\tilde{\omega}_m$ | $(K_d V_{dLN} - K_{eLN})\tilde{\omega}_m$ | negligible | | | Speed estimate error LPF makes only the DC component of $\tilde{\omega}_m$ significant; for any sensors used for commutation, this is 0. |
| $\tilde{I}_q$ | $-\tilde{I}_q R_{LN}$ | small to moderate | 2–5% $I_q R_{LN}$ | | Current sensor tolerance |
| $\tilde{V}_{qLN}$ | $\tilde{V}_{qLN}$ | Moderate | 2% $V_0$ | | Voltage sensor tolerance (resistor divider) |
| $I_d \neq 0$ | $I_d\omega_e L_{LN}$ | negligible | | | Current controller error: $I_d$ is controlled to 0 with a PI loop, so when $r_q$ is LPF, this term |

-continued

| Source of error | Approx. (small-signal) error in $r_q$ | Significance | | | |
|---|---|---|---|---|---|
| | | qualitative | typical quantitative | Δ (Δ: is this term reduced when comparing halves of a redundant motor?) | |
| | | | | | disappears |
| $\frac{dI_q}{dt} \neq 0$ | $L_{LN}\frac{dI_q}{dt}$ | very small | $2L_{LN}\frac{I_{qlim}}{\tau_{LPF}}$ | yes ($I_{qdm} \approx 0$) | Changing current command: LPF makes this term small except for slow ramp rates from full regen to full motoring current (or vice-versa) |
| $\tilde{\theta}_e$ | $K_{eLN}\omega_m(1-\cos\tilde{\theta}_e)$ | small to moderate | $15° \rightarrow 3.4\% V_0$ $10° \rightarrow 1.5\% V_0$ $5° \rightarrow 0.4\% V_0$ | | Error in electrical angle estimate: LPF makes only DC component of $\tilde{\theta}_e$ significant |
| $\tilde{K}_d$ | $\tilde{K}_d V_{dLN}\omega_m$ | Small | $10\% K_d V_{dLN}\omega_m$ | | Error in phase lag compensation due to filter time constant uncertainty. (R and C tolerances) $K_d\omega_m$ is a filter phase lag and should be under 0.25 radians, which would make this term about 2.5% $V_{dLN}$, which is significant only at high power levels |

[1]Assuming differential mode $I_q$ between halves of a redundant motor is small, this term is reduced.

Example system: max $I_q$=35 A, $V_0$=42V (72Vbus), $R_{LN}$=0.14 ohm, $L_{LN}$=0.44 mH, $\tau_{LPF}$=0.1 s, $K_d\omega_m \leq 0.2$ rad, $\omega_e \leq 1880$ rad/s (300 Hz)

$\tilde{R}_{LN}$: largest $I_q R_{LN}$=4.9V=12% $V_0$ (so in this case $\tilde{R}_{LN}$ and $\tilde{I}_q$ terms are small) →effect of $\tilde{R}_{LN}$ is about 1.2% $V_0$ worst case $$\frac{dI_q}{dt} \neq 0: \text{ largest } LPF\left(L_{LN}\frac{dI_q}{dt}\right) = 2L_{LN}\frac{I_{qlim}}{\tau_{LPF}} = 0.31 \text{ V} = 0.7\% V_0$$

$\tilde{K}_d$: $V_{dLN} \approx -I_q \omega_e L_{LN} \leq 29V$

10% $K_d V_{dLN}\omega_m \leq 0.1 \times 0.2 \times 29V = 0.58V = 1.4\% V_0$

So the largest sources of error in LPF($r_q$) are probably $\tilde{K}_{eLN}$ (7% $V_0$ at high speeds) and $\tilde{V}_{qLN}$ (2%), with $\tilde{R}_{LN}$, $\tilde{K}_d$, and $\tilde{\theta}_e$ in the 1% range and everything else under 1%. Comparing $r_q$ between redundant halves should greatly reduce the $\tilde{K}_{eLN}$ term.

Appendix B: Filter Lag Compensation

Figure 5A:
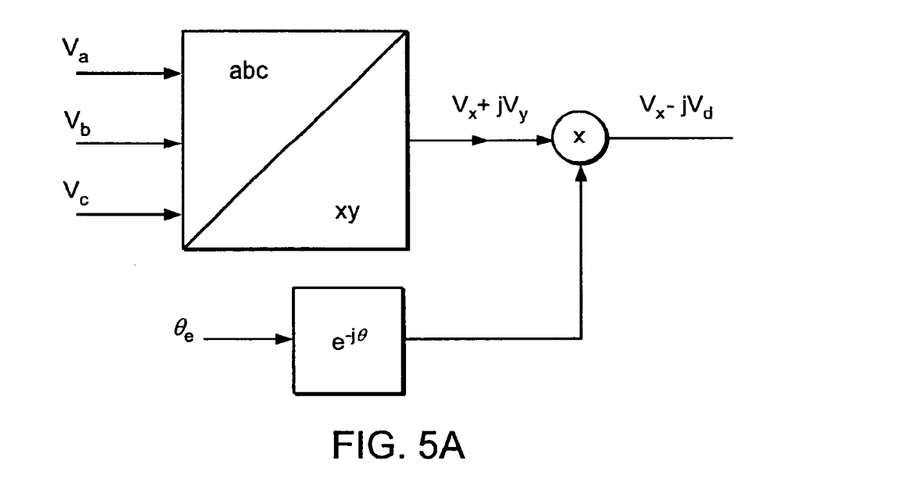
FIGS. 5A–5D illustrate filter lag compensation.
Figure 5B:
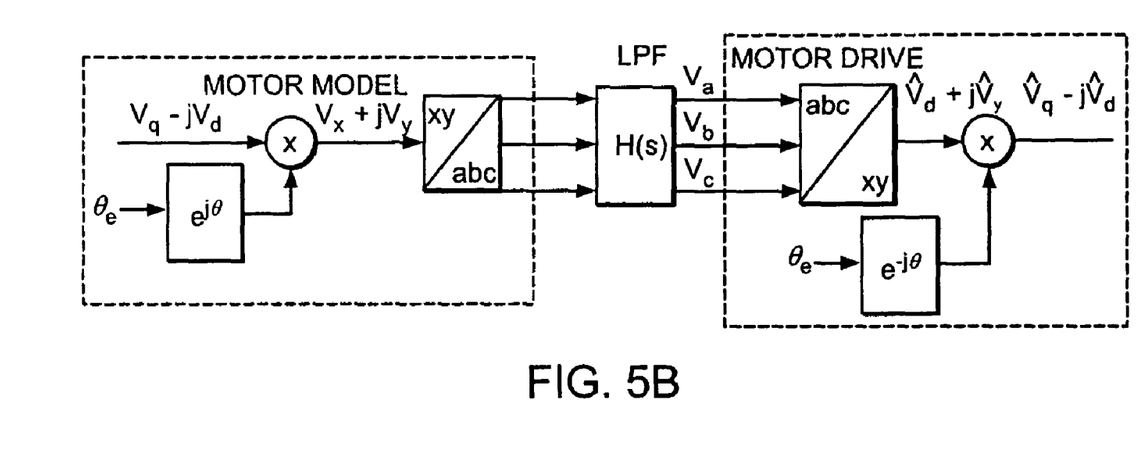
Figure 5C:
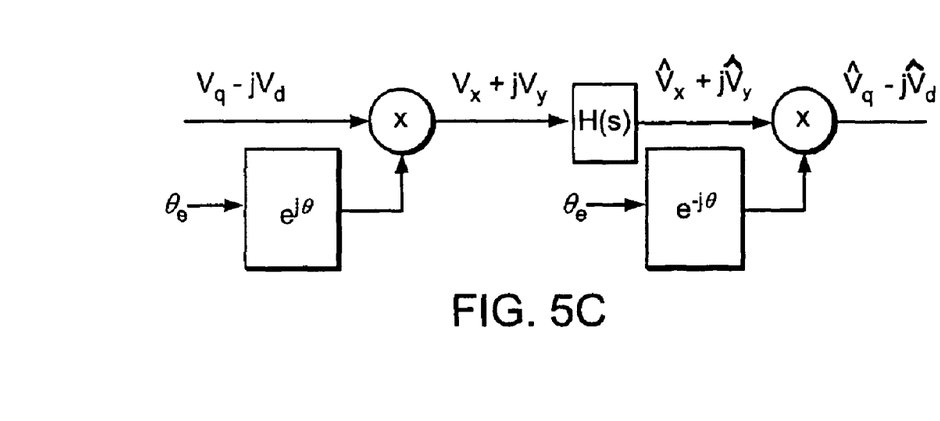

If we are sensing motor phase voltages using the method depicted in FIG. 5A and $V_a$, $V_b$, $V_c$ are sensed after passing through a low-pass filter, $$H(s) = \frac{1}{1 + \tau s(\text{higher order terms})},$$

this will cause an error in the derived values $V_d$, $V_q$, as shown in FIG. 5B. The xy/abc transformations are linear and this model can be simplified to the algorithm illustrated in FIG. 5C.

Figure 5D:
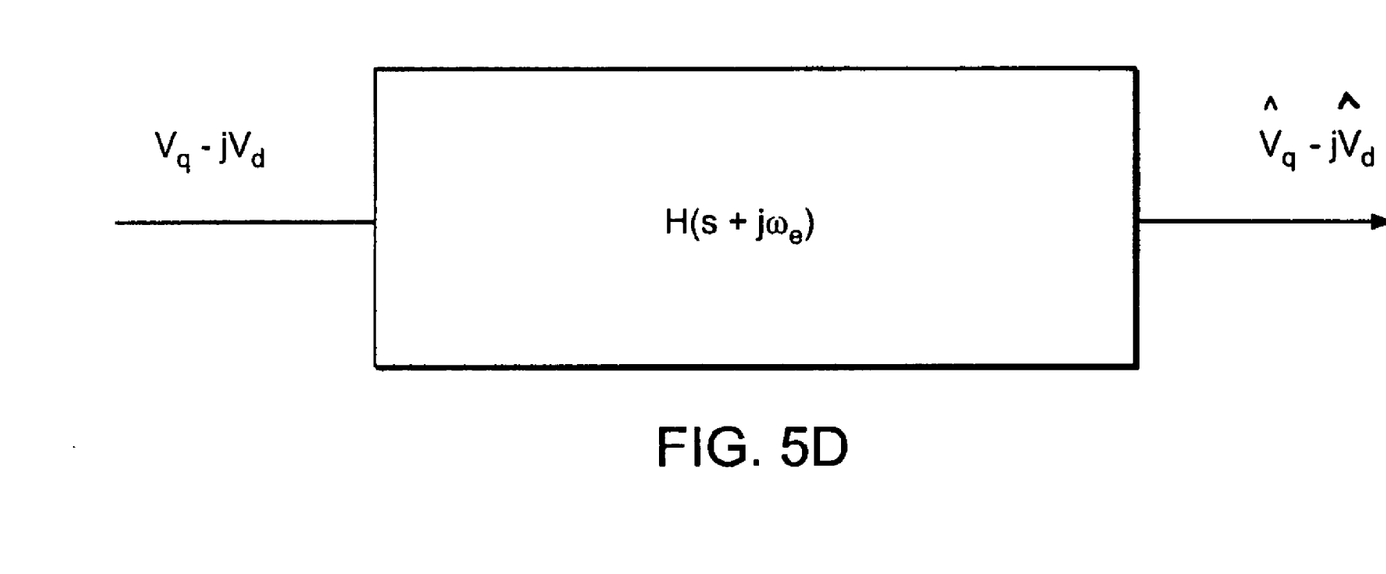

This can be further simplified to the algorithm shown in FIG. 5D, where $$\omega_e = \frac{d\theta e}{dt}.$$

So that a filter acting in the stationary frame is equivalent to the same filter, frequency shifted by the electrical frequency of the motor, in the synchronous frame.

One effect of this, is that at DC in the synchronous frame, $$\hat{V}_q - j\hat{V}_d = H(j\omega_e) \cdot (V_q - jV_d)$$

$$\approx \frac{1}{1 + \tau \cdot (j\omega_e)} \cdot (V_q - jV_d)$$

(we can drop higher order terms if $(\omega_e)\tau \ll 1$)

This attenuates the $V_{dq}$ vector slightly and rotates it slightly. We can compensate for this effect:

$$\hat{V}_q - j\hat{V}_d = (\hat{V}_q - j\hat{V}_d) \cdot (1 + j\omega_e\tau) \approx V_q - jV_d$$

$$\hat{V}_q = \hat{V}_q + \hat{V}_d \cdot \omega_e \tau = \hat{V}_q + \hat{V}_d \cdot K_{d\omega m}$$

$$\hat{V}_d = \hat{V}_d - \hat{V}_q \cdot \omega_e \tau = \hat{V}_d - \hat{V}_q \cdot K_{d\omega m}$$

where $$K_d = \frac{P}{2} \cdot \tau$$

P=# of motor poles and
where $\hat{V}_q$, $\hat{V}_d$ are compensated quantities,
while $\hat{V}_q$, $\hat{V}_d$ are derived from measurement.

For open winding detection, only the compensated voltage $\hat{V}_q$ is needed, which is equal to $\hat{V}_q + \hat{V}_d \cdot K_{d\omega m}$. Hence, this extra term "$K_d V_{dLN} \omega_m$" is incorporated into the equation for the voltage residue, $r_q$, to compensate for filter time delay.

Note $\tau$ is actually a relative time $\Delta\tau$; if we measure $\theta_e$ using a low-pass filter with time lag $\tau_\theta$, and measure currents using a low-pass filter, also with time lag $\tau_\theta$, but $V_a$, $V_b$, and $V_c$ are using an LPF with time lag $\tau_V$, then we should use $$K_d = \frac{P}{2} \cdot (\tau_v - \tau_o)$$

to calculate voltages that would correspond to the currents and phase angles, which have time delay $\tau_o$ and not calculate the actual voltages with no time delay.

What is claimed is:

1. A method for detecting an open winding condition in a motor, the method comprising:
   a. measuring a winding voltage, a winding current and a motor speed;
   b. calculating a residue voltage for the winding, the residue voltage equaling the difference between a measured voltage drop across the winding and a calculated voltage drop for a non-open winding condition as a function of the measured winding current and motor speed; and
   c. comparing the residue voltage to a threshold value.

2. A method according to claim 1, further including:
   d. signaling when the residue voltage exceeds the threshold value, to declare an open winding condition.

3. A method for detecting an open winding condition in a dual-stator redundant motor, the method comprising:
   a. measuring a first stator winding voltage, a first stator winding current and the motor speed;
   b. computing a first residue voltage for the first stator winding, the first residue voltage equaling the difference between a measured voltage drop across the first stator winding and a calculated voltage drop value for a non-open first stator winding as a function of the measured first stator winding current and motor speed;
   c. measuring a second stator voltage across a second stator winding and a second current through the second stator winding;
   d. calculating a second residue voltage for the second stator winding, the second residue voltage equaling the difference between a measured voltage drop across the second stator winding and a calculated voltage drop value for a non-open second stator winding as a function of the measured second stator winding current and motor speed;
   e. calculating a residue voltage difference equal to the magnitude of the difference between the first residue voltage and the second residue voltage; and
   f. comparing the residue voltage difference to a threshold value.

4. A method according to claim 3, the method further including:
   g. signaling when the residue voltage difference exceeds the threshold value, to declare an open winding condition.

5. A method according to claim 4, the method further including:
   h. signaling when the first residue voltage exceeds a first residue threshold value to declare an open winding condition.

6. A method according to claim 3, the method further including compensating for measurement delay before calculating a residue voltage difference.

* * * * *